United States Patent
Bedell et al.

(10) Patent No.: US 8,486,776 B2
(45) Date of Patent: Jul. 16, 2013

(54) STRAINED DEVICES, METHODS OF MANUFACTURE AND DESIGN STRUCTURES

(75) Inventors: Stephen W. Bedell, Wappingers Falls, NY (US); Kangguo Cheng, Guilderland, NY (US); Bruce B. Doris, Brewster, NY (US); Ali Khakifirooz, Mountain View, CA (US); Pranita Kulkarni, Slingerlands, NY (US); Katherine L. Saenger, Ossining, NY (US)

(73) Assignee: International Business Machines Corporation, Armonk, NY (US)

( * ) Notice: Subject to any disclaimer, the term of this patent is extended or adjusted under 35 U.S.C. 154(b) by 140 days.

(21) Appl. No.: 12/886,881

(22) Filed: Sep. 21, 2010

(65) Prior Publication Data
US 2012/0068267 A1    Mar. 22, 2012

(51) Int. Cl.
*H01L 21/00* (2006.01)
(52) U.S. Cl.
USPC ........... 438/166; 438/154; 438/480; 438/311; 257/E21.563
(58) Field of Classification Search
USPC ........... 438/480, 311, 154, 166; 257/E21.563
See application file for complete search history.

(56) References Cited

U.S. PATENT DOCUMENTS

| | | | |
|---|---|---|---|
| 6,774,015 B1 * | 8/2004 | Cohen et al. | 438/479 |
| 6,972,247 B2 | 12/2005 | Bedell et al. | |
| 6,989,058 B2 | 1/2006 | Bedell et al. | |
| 6,991,998 B2 | 1/2006 | Bedell et al. | |
| 6,992,025 B2 | 1/2006 | Maa et al. | |
| 7,029,994 B2 | 4/2006 | Ge et al. | |
| 7,282,402 B2 * | 10/2007 | Sadaka et al. | 438/221 |
| 7,368,358 B2 | 5/2008 | Ouyang et al. | |
| 7,387,925 B2 | 6/2008 | Shang et al. | |
| 7,485,518 B2 | 2/2009 | Chan et al. | |
| 7,494,902 B2 | 2/2009 | Jurczak et al. | |
| 7,524,707 B2 | 4/2009 | Adetutu et al. | |
| 2005/0029619 A1 * | 2/2005 | Forbes | 257/516 |
| 2005/0093154 A1 * | 5/2005 | Kottantharayil et al. | 257/745 |
| 2006/0081837 A1 | 4/2006 | Bedell et al. | |
| 2006/0160291 A1 * | 7/2006 | Lee et al. | 438/199 |

(Continued)

OTHER PUBLICATIONS

Tezuka et al., "Fabrication and electrical characterization . . . high-mobility channels", Transactions of the Institute of Electrical Engineers of Japan, 2006, vol. 126-C, No. 11, (Abstract only).

(Continued)

*Primary Examiner* — Jarrett Stark
(74) *Attorney, Agent, or Firm* — Matthew Zehrer; Roberts Mlotkowski Safran & Cole, P.C.

(57) ABSTRACT

Strained Si and strained SiGe on insulator devices, methods of manufacture and design structures is provided. The method includes growing an SiGe layer on a silicon on insulator wafer. The method further includes patterning the SiGe layer into PFET and NFET regions such that a strain in the SiGe layer in the PFET and NFET regions is relaxed. The method further includes amorphizing by ion implantation at least a portion of an Si layer directly underneath the SiGe layer. The method further includes performing a thermal anneal to recrystallize the Si layer such that a lattice constant is matched to that of the relaxed SiGe, thereby creating a tensile strain on the NFET region. The method further includes removing the SiGe layer from the NFET region. The method further includes performing a Ge process to convert the Si layer in the PFET region into compressively strained SiGe.

20 Claims, 5 Drawing Sheets

U.S. PATENT DOCUMENTS

2006/0258073 A1* 11/2006 Greene et al. .............. 438/199
2007/0254422 A1* 11/2007 Chidambarrao et al. ..... 438/197
2009/0224321 A1*  9/2009 Tsuchiya ..................... 257/351
2012/0098067 A1*  4/2012 Yin et al. ..................... 257/351

OTHER PUBLICATIONS

Krishnamohan et al., "High Mobility Ultrathin Strained Ge MOSFETs on Bulk and SOI With Low Band-to-Band Tunneling Leakage: Experiments", IEEE Transactions on Electron Devices, vol. 53, No. 5, May 2006, pp. 990-999.

Shim et al., "Hole Mobility Behavior in Strained SiGe-on-SOI p-MOSFETs", 213th ECS Meeting, (1 page), May 20, 2008.

Wang et al., "Strained Silicon-Germanium-On-Insulator n-MOSFET With Embedded Silicon Source-and-Drain Stressors", IEEE Electron Device Letters, vol. 29, No. 1, Jan. 2008, pp. 77-79.

* cited by examiner

STRAINED DEVICES, METHODS OF MANUFACTURE AND DESIGN STRUCTURES

FIELD OF THE INVENTION

The invention relates to semiconductor structures and methods of manufacture and, more particularly, to strained Si and strained SiGe on insulator devices, methods of manufacture and design structures.

BACKGROUND

Strained Si has been adopted as a promising option to improve complementary metal oxide semiconductor (CMOS)-based transistor device performance. For example, strained silicon on insulator (SSOI) technology is a promising way to increase electron mobility in CMOS technologies such as, for example, FinFET, trigate, ultrathin body SOI and nanowires. However, current methods to fabricate SSOI wafers are very expensive. For example, the most common approach is to grow a strained Si layer on a relaxed SiGe buffer layer, which is grown epitaxially on a "donor" Si substrate and then transfer the strained Si layer to a handle wafer by a bonding, smartcut, and etch back process. However, since the SiGe buffer layer needs to be very thick this method is very expensive.

More specifically, Si is deposited on a layer of relaxed SiGe to produce a Si layer that is under tensile strain. Strained Si on SiGe has also been used in conjunction with silicon-on-insulator (SOI) to combine the benefits of both technologies. The intervening SiGe layer, however, causes complications in processes such as, for example, enhanced N-type dopant diffusion, Si/SiGe intermixing, shallow trench isolation (STI) process complications, and possible negative effects on silicide formation.

Accordingly, there exists a need in the art to overcome the deficiencies and limitations described hereinabove.

SUMMARY

In a first aspect of the invention, a method comprises growing an SiGe layer on a silicon on insulator wafer. The method further comprises patterning the SiGe layer into PFET and NFET regions such that a strain in the SiGe layer in the PFET and NFET regions is relaxed. The method further comprises amorphizing by ion implantation at least a portion of an Si layer directly underneath the SiGe layer in the NFET region. The method further comprises performing a thermal anneal to recrystallize the Si layer such that a lattice constant is matched to that of the relaxed SiGe, thereby creating a tensile strain on the NFET region. The method further comprises removing the SiGe layer from the NFET region. The method further comprises performing a Ge process to convert the Si layer in the PFET region into compressively strained SiGe.

In another aspect of the invention, a method comprises epitaxially growing a SiGe layer on a Si layer of a silicon in insulator (SOI) wafer. The method further comprises patterning PFET and NFET regions comprising the SiGe layer and the Si layer such that the SiGe layer becomes relaxed. The method further comprises straining the NFET region by amorphizing by ion implantation the Si layer and performing a thermal anneal to recrystallize the Si layer such that a lattice constant is matched to that of the relaxed SiGe, thereby creating a tensile strain on the NFET region. The method further comprises straining the PFET region by performing a Ge process to convert the Si layer in the PFET region into compressively strained SiGe.

In yet another aspect of the invention, a structure comprises a tensilely strained NFET region comprising an amorphized ion implanted and thermally annealed recrystallized Si layer of a silicon on insulator wafer that has a lattice constant matched to that of a relaxed SiGe layer. The structure further comprises a compressively strained PFET region comprising an SiGe layer which was converted from a Si layer of the silicon on insulator wafer.

In another aspect of the invention, a design structure tangibly embodied in a machine readable storage medium for designing, manufacturing, or testing an integrated circuit is provided. The design structure comprises the structures of the present invention. In further embodiments, a hardware description language (HDL) design structure encoded on a machine-readable data storage medium comprises elements that when processed in a computer-aided design system generates a machine-executable representation of the strained device, which comprises the structures of the present invention. In still further embodiments, a method in a computer-aided design system is provided for generating a functional design model of the strained device. The method comprises generating a functional representation of the structural elements of the strained device.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The invention relates to semiconductor structures and methods of manufacture and, more particularly, to strained Si and SiGe on insulator devices and methods of manufacture. Advantageously, the methods of the present invention enhance carrier mobility in silicon on insulator (SOI) devices such as, for example, FinFETs, trigates, ultrathin body SOI devices and nanowires. The present invention also reduces fabrication costs by eliminating the need for growing a strained Si layer on a relaxed, thick SiGe buffer layer, which is grown epitaxially on a "donor" Si substrate and then transferring the strained Si layer to a handle wafer by bonding, smartcut, and etch back processes. Also, since strained Si and SiGe devices have lower threshold voltage than relaxed Si, it is possible to obtain multiple Vt devices on the same wafer without the need for different gate stacks or implants to adjust Vt.

In embodiments, the present invention includes fabricating strained Si (with tensile strain) and SiGe (compressive strain) on insulator by epitaxial growth of SiGe on top of a SOI wafer, and patterning the Si and SiGe to small areas corresponding to active areas of the device. The methods of the present invention place a strain in the active areas by, for example, annealing processes, and Ge mixing with thermal annealing or Ge condensation methodologies.

Figure 1:
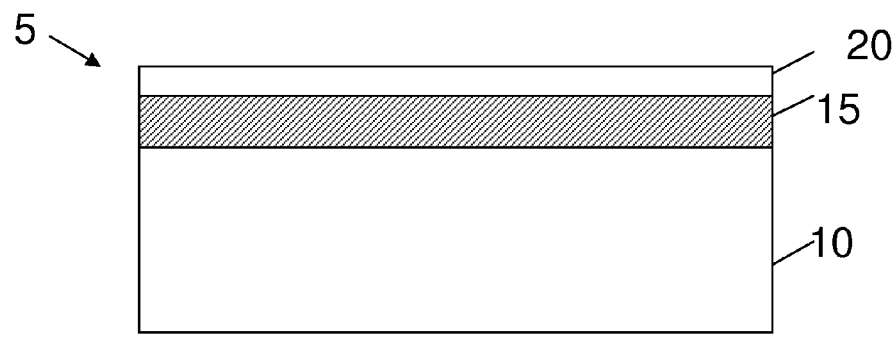
FIGS. 1-6, 7*a*, 7*b* and 8 show various structures and respective processing steps in accordance with aspects of the invention.

FIG. 1 shows a beginning structure and fabrication processes in accordance with aspects of the present invention. More specifically, the structure 5 comprises a silicon on insulator (SOI) structure. In particular, the SOI structure 5 includes a silicon wafer substrate 10. An oxide layer 15 is provided on the substrate 10. In embodiments, the oxide layer 15 is about 10 Å to about 2000 Å in thickness, and in particular about 250 Å to 1000 Å in thickness. In embodiments, the oxide layer 15 is resistant to Ge diffusion. The oxide layer 15 can also be a non-crystalline oxide or nitride layer. A silicon layer 20 is provided on the oxide layer 15. In embodiments, the silicon layer 20 is about 5 nm to about 50 nm in thickness.

Figure 2:
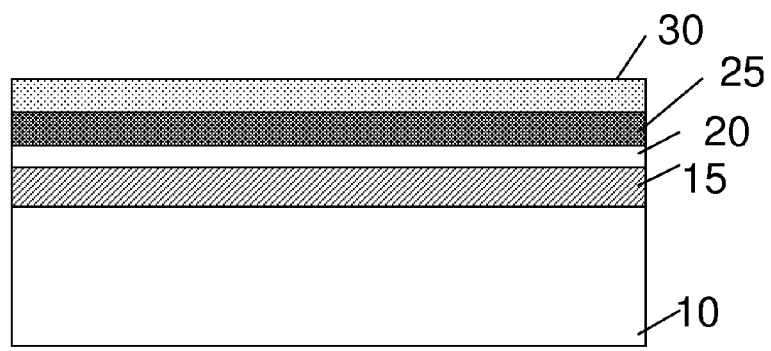

In FIG. 2, a SiGe layer 25 is provided on the silicon layer 20. In embodiments, the SiGe layer 25 can be epitaxially grown on the silicon layer 20. In embodiments, the SiGe layer 25 is a strained SiGe layer and is about 10-200 nm, in thickness. In embodiments, the SiGe layer 25 and underlying silicon layer 20 have different lattice constants. The Ge concentration of the SiGe layer 25 can vary, depending on the device parameters. For example, the concentration can be 15-65%. An optional pad layer 30, e.g., nitride pad, can be deposited on the SiGe layer 25.

In optional embodiments, parts of the wafer dedicated for low power NFETs and PFETs can be covered with an insulator (mask layer of material) so that SiGe does not grow in these areas. Alternatively, the SiGe layer 25 can be stripped from these areas.

Figure 3:
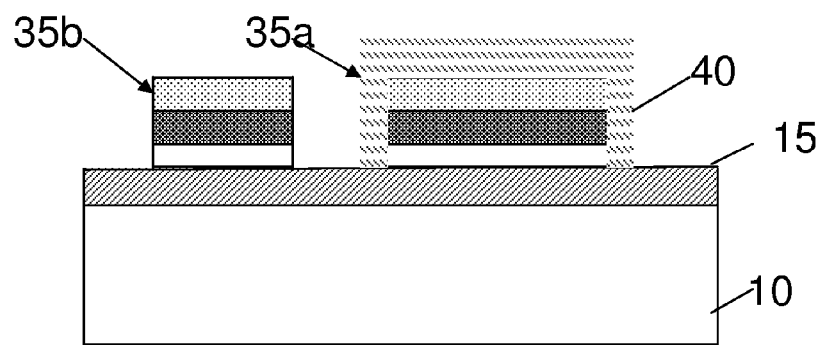

As shown in FIG. 3, small regions 35a and 35b are patterned from the Si layer 20, SiGe layer 25 and optional pad layer 30 to form active areas for transistors, formed in later processing steps. More specifically, in embodiments, the SiGe layer 25 and optionally Si layer 20 can be patterned into small regions so that the strain in the SiGe layer 25 is relaxed. In embodiments, the small regions are about 20 nm to 200 nm. In embodiments, the patterning is formed by conventional lithographic and etching processes. For example, a resist is deposited on the pad layer 30 (or SiGe layer 25) and exposed to light to form a pattern (holes), exposing the underlying layer. A dry plasma etch, for example, is then performed to pattern the small regions 35a, 35b. The resist can then be stripped by one of several different methodologies such as, for example, oxygen ashing, $N_2H_2$ or wet cleaning using, for example, sulfuric peroxide.

In embodiments, the structure of FIG. 3 can undergo an optional annealing step. In embodiments, the annealing step can be at a temperature of about 900° C. to 1080° C., for a time of about 0 to 5 seconds. In embodiments, the annealing step should not cause Ge diffusion into Si.

Figure 4:
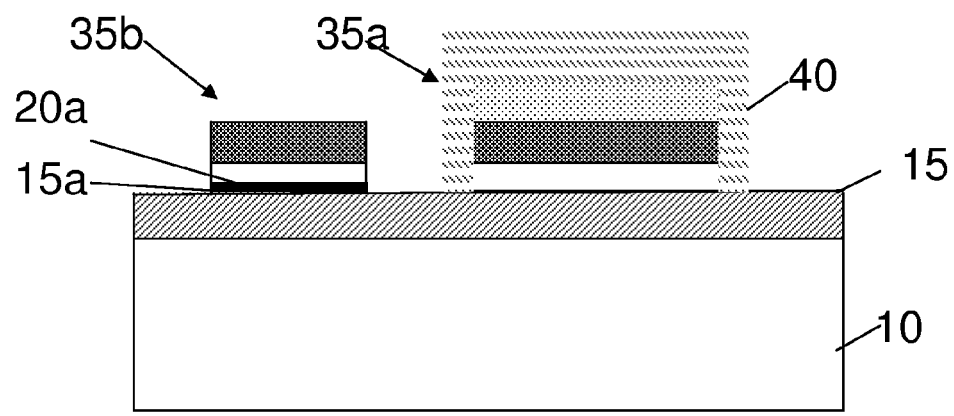

In FIG. 4, the small region 35a can be protected with a hardmask 40 so that the small region 35b can undergo additional processing. More specifically, an oxide hardmask 40 is deposited on the small region 35a dedicated to a PFET. In embodiments, the hardmask 40 can also be deposited on the small region 35b, dedicated to an NFET; however, the hardmask on the small region 35b and the optional pad layer 30 are removed over the small region 35b in a subsequent processing step. Ion implantation is used to amorphize the bottom portion 20a of the Si layer 20 (directly underneath and in contact with the SiGe layer 25) in the NFET region 35b with energy and dose optimized not to damage the SiGe layer 25. More specifically, the ion implantation can be, for example, nitrogen, oxygen, xenon, or germanium, at an energy depending on depth and species used and a dose of about 3E14 to 3E15. Preferably, channeling implant is used to avoid damaging the crystalline SiGe and Si.

In further embodiments, amorphization starts at the insulator interface 15a and propagates from bottom to the top. Optionally the whole Si layer 20 and part of the SiGe layer 25 can be amorphized in the NFET region 35b. Also, optionally the implantation can be performed at temperatures higher than room temperature and with relatively light ions to minimize defects to the SiGe layer 25. For example, the relative light ions can be Si, N, or F, and the temperatures can be about 50° C.-300° C.

Figure 5:
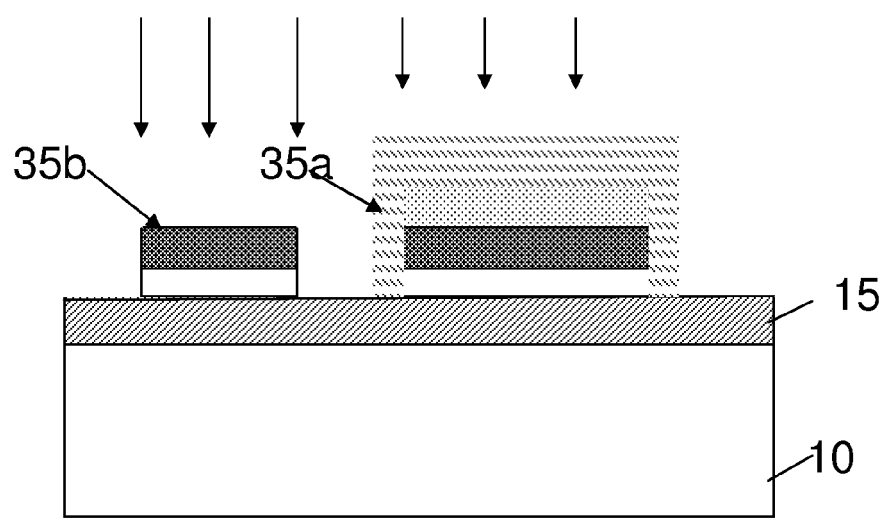

In FIG. 5, an annealing step is performed which relaxes any remaining stress in the SiGe layer 25. For example, the annealing step can be performed at a temperature of about 1050° C., for a time of about 0 seconds to about 5 seconds. In this processing step, the amorphized Si layer 20a is crystallized with the lattice constant matched to that of the relaxed SiGe. This will result in a tensile strain in the NFET region 35b.

Figure 6:
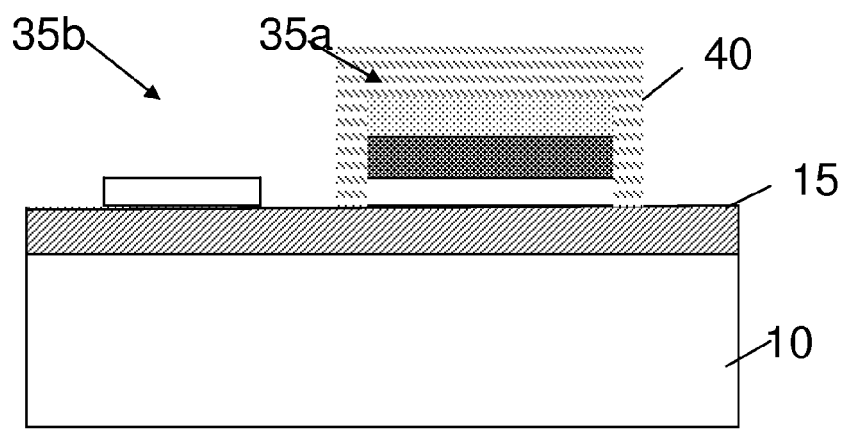

As shown in FIG. 6, the SiGe layer is removed from the NFET region 35b. For example, the SiGe layer can be removed by a gas phase HCl etch. In embodiments, the PFET region 35a can be protected by the hardmask 40, during this removal process.

Figure 7A:
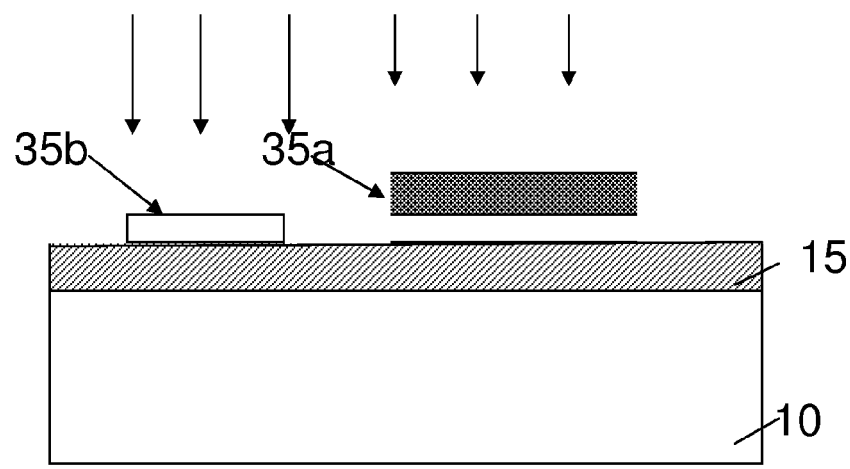

FIG. 7a shows an optional processing step to form a compressive strain on the PFET region 35a. In FIG. 7a, the hardmask and pad layer are removed from the PFET region 35a. The structure then undergoes a Ge mixing with a thermal annealing in an inert ambient. In embodiments, the thermal annealing is performed at a temperature of about 1200° C. to 1330° C., for a time period of about 10-1800 minutes. This results in the SiGe layer/Si layer (layers 20 and 25) being placed in a compressive state for the PFET region 35a. In embodiments, any remaining SiGe layer 25 may be removed by wet etching processes.

Figure 7B:
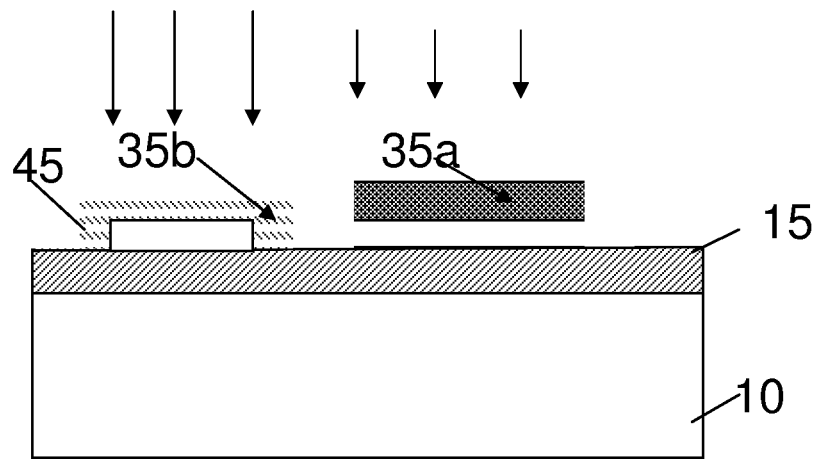

FIG. 7b shows an optional processing step to form a compressive strain on the PFET region 35a. In FIG. 7b, the hardmask and pad layer are removed from the PFET region 35a, and the NFET region 35b is covered with a mask 45, e.g., nitride mask. The structure then undergoes a Ge condensation process to convert the PFET region 35a into a compressively strained SiGe region. In embodiments, the Ge condensation process can be performed by annealing oxidizing the wafer so that Ge diffuses into Si in the PFET region 35a.

Figure 8:
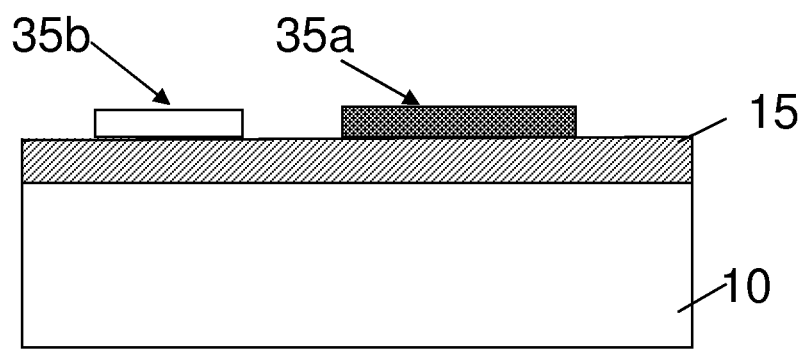

As shown in FIG. 8, the nitride mask (cap) is removed from the NFET region 35b. Also, in embodiments, part of the Si from the SiGe region (higher oxidation rate) and Si region (lower oxidation rate) is oxidized, which is etched away. In further embodiments, the active regions (35a and 35b) are cut into long and narrow structures to convert the biaxial stress into uniaxial stress. The long and narrow structures can, for example, have dimensions of about 20 nm to 2000 nm.

Figure 9:
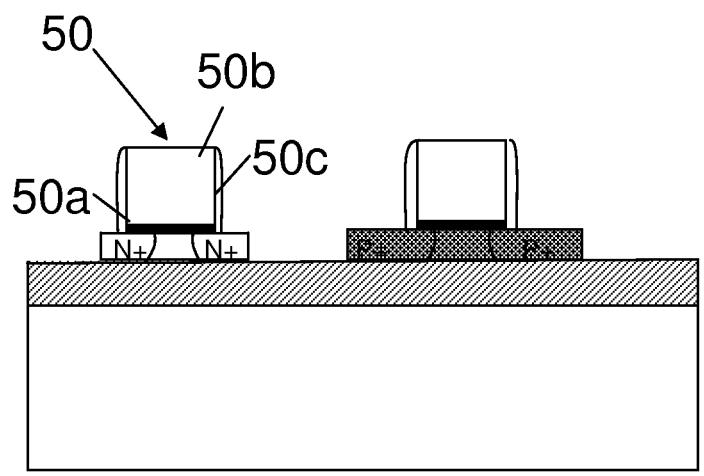
FIG. 9 shows a device formation and respective process steps formed on the structure of FIG. 8, in accordance with aspects of the invention.

In FIG. 9, device fabrication is continued as in conventional CMOS processes. For example, a gate 50 is formed by deposition of a gate dielectric 50a and gate material 50b on the active regions 35a, 35b, through conventional deposition and etching processes. In embodiments, the gate dielectric 50a can be oxide, hafnium oxide or other high-k dielectric or combination thereof, depending on the designed performance. In embodiments, the gate material 50b can be a poly material, with nitride spacers 50c. In accordance with the present invention, since strained Si and SiGe devices have lower threshold voltage than relaxed Si, it is possible to obtain multiple Vt devices on the same wafer w/o need to different gate stacks or implants to adjust Vt.

Figure 10:
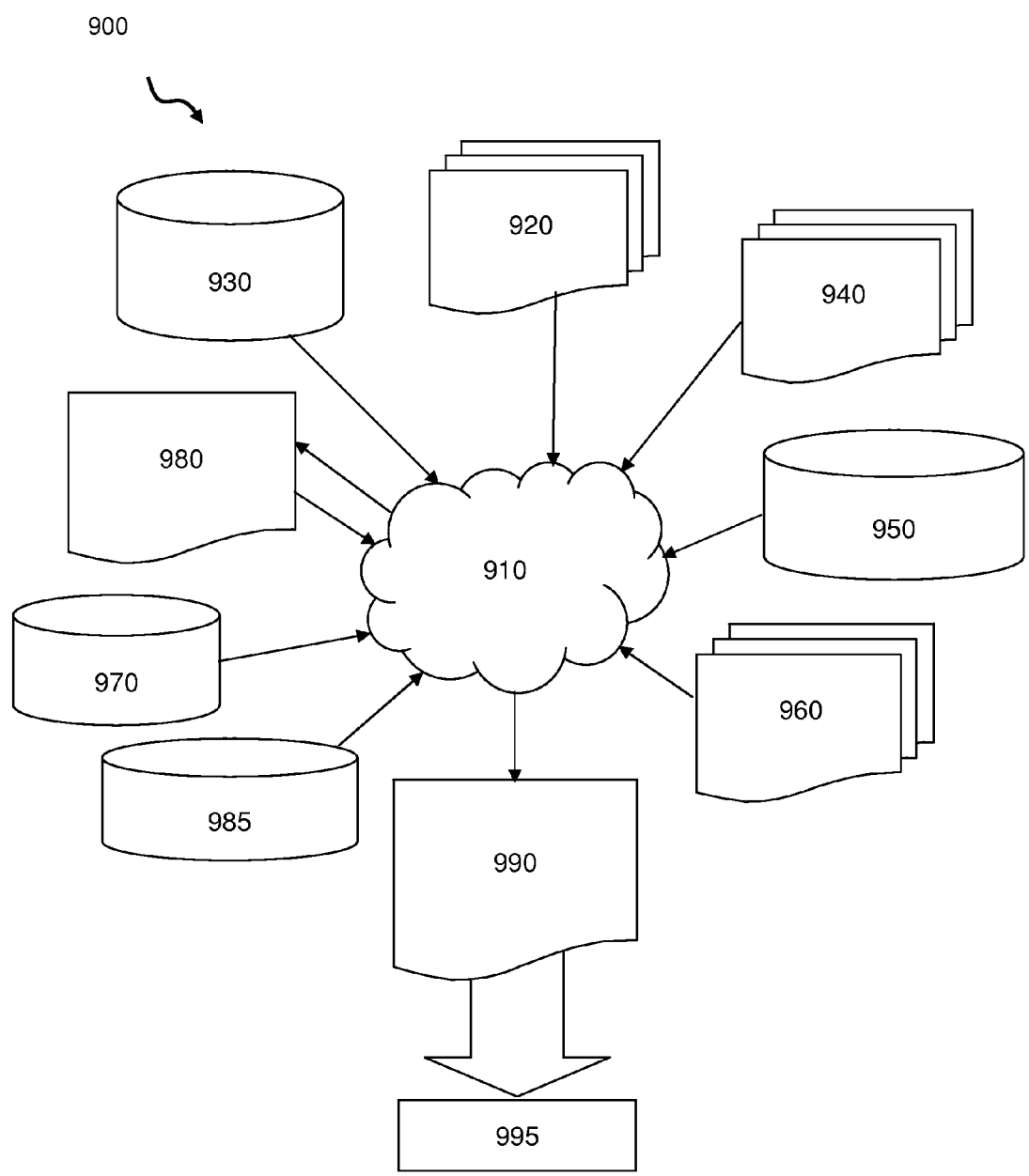
FIG. 10 is a flow diagram of a design process used in semiconductor design, manufacture, and/or test.

FIG. 10 is a flow diagram of a design process used in semiconductor design, manufacture, and/or test. FIG. 10 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIGS. 1-6, 7a, 7b, 8 and 9. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 10 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 1-6, 7a, 7b, 8 and 9. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 1-6, 7a, 7b, 8 and 9 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990.

Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-6, 7a, 7b, 8 and 9. In one embodiment, design structure 990 may comprise a compiled, executable HDL simulation model that functionally simulates the devices shown in FIGS. 1-6, 7a, 7b, 8 and 9.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-6, 7a, 7b, 8 and 9. Design structure 990 may then proceed to a stage 995 where, for example, design structure 990: proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims, if applicable, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principals of the invention and the practical application, and to enable others of ordinary skill in the art to understand the invention for various embodiments with various modifications as are suited to the particular use contemplated. Accordingly, while the invention has been described in terms of embodiments, those of skill in the art will recognize that the invention can be practiced with modifications and in the spirit and scope of the appended claims.

What is claimed is:

1. A method comprising:
   growing an SiGe layer on a silicon on insulator wafer;
   patterning the SiGe layer into PFET and NFET regions such that a strain in the SiGe layer in the PFET and NFET regions is relaxed;
   amorphizing by ion implantation at least a portion of an Si layer directly underneath the SiGe layer in the NFET region;
   performing a thermal anneal to recrystallize the Si layer such that a lattice constant is matched to that of the relaxed SiGe, thereby creating a tensile strain on the NFET region;
   removing the SiGe layer from the NFET region; and
   performing a Ge process to convert the Si layer in the PFET region into compressively strained SiGe.

2. The method of claim 1, wherein the growing is an epitaxial growth on the Si layer of the silicon on insulator wafer.

3. The method of claim 1, wherein parts of the silicon on insulator wafer dedicated for low power NFET and PFET devices are covered with an insulator such that SiGe is not grown on the parts on insulator wafer dedicated for low power NFET and PFET devices.

4. The method of claim 1, further comprising stripping the SiGe layer over parts of the silicon on insulator wafer dedicated for low power NFET and PFET devices.

5. The method of claim 1, wherein the patterning further includes patterning the Si layer of the silicon on insulator wafer.

6. The method of claim 1, further comprising annealing the PFET and NFET regions at temperatures that do not cause Ge diffusion into Si.

7. The method of claim 1, wherein the amorphizing by ion implantation includes amorphizing an entirety of the Si layer and part of the SiGe layer.

8. The method of claim 7, wherein the implantation is performed at temperatures higher than room temperature and with relatively light ions to minimize defects to the SiGe layer.

9. The method of claim 1, wherein the Ge process includes Ge mixing with thermal annealing.

10. The method of claim 1, wherein the Ge process includes masking the NFET region and performing Ge condensation to the PFET region to convert the Si layer to the compressively strained SiGe.

11. The method of claim 1, further comprising oxidizing and etching away part of the Si layer on the NFET.

12. The method of claim 1, further comprising cutting active regions comprising the NFET region and PFET regions to convert biaxial stress into uniaxial stress.

13. A method, comprising:
    epitaxially growing a SiGe layer on a Si layer of a silicon in insulator (SOI) wafer;
    patterning PFET and NFET regions comprising the SiGe layer and the Si layer such that the SiGe layer becomes relaxed;
    straining the NFET region by amorphizing by ion implantation the Si layer and performing a thermal anneal to recrystallize the Si layer such that a lattice constant is matched to that of the relaxed SiGe, thereby creating a tensile strain on the NFET region; and
    straining the PFET region by performing a Ge process to convert the Si layer in the PFET region into compressively strained SiGe.

14. The method of claim 13, wherein parts of the SOI wafer dedicated for low power NFET and PFET devices are covered with a material such that SiGe is not grown on the parts.

15. The method of claim 13, further comprising stripping the SiGe layer over parts of the silicon on insulator wafer dedicated for low power NFET and PFET devices.

16. The method of claim 13, further comprising annealing the NFET and PFET devices at temperatures that do not cause Ge diffusion into Si.

17. The method of claim 13, wherein the Ge process includes Ge mixing with thermal annealing.

18. The method of claim 13, wherein the Ge process includes masking the NFET region and performing Ge condensation to the PFET region to convert the Si layer to the compressively strained SiGe.

19. The method of claim 13, further comprising cutting active regions comprising the NFET region and PFET regions to convert biaxial stress into uniaxial stress.

20. The method of claim 13, wherein:
 the amorphizing by ion implantation includes amorphizing an entirety of the Si layer and part of the SiGe layer; and
 the implantation is performed at temperatures higher than room temperature and with relatively light ions to minimize defects to the SiGe layer.

* * * * *